(12) United States Patent
Shimoji

(10) Patent No.: US 9,196,981 B2
(45) Date of Patent: Nov. 24, 2015

(54) CONNECTOR

(75) Inventor: Kenichi Shimoji, Tokyo (JP)

(73) Assignee: JAPAN AVIATION ELECTRONICS INDUSTRY, LIMITED, Shibuya-Ku, Tokyo (JP)

( * ) Notice: Subject to any disclaimer, the term of this patent is extended or adjusted under 35 U.S.C. 154(b) by 103 days.

(21) Appl. No.: 13/995,882

(22) PCT Filed: Aug. 4, 2011

(86) PCT No.: PCT/JP2011/067830
§ 371 (c)(1),
(2), (4) Date: Jun. 19, 2013

(87) PCT Pub. No.: WO2012/098719
PCT Pub. Date: Jul. 26, 2012

(65) Prior Publication Data
US 2013/0267102 A1 Oct. 10, 2013

(30) Foreign Application Priority Data
Jan. 20, 2011 (JP) ................... 2011-009416

(51) Int. Cl.
H01R 12/70 (2011.01)
H01R 43/20 (2006.01)
H01R 13/41 (2006.01)
H01R 12/75 (2011.01)
H05K 1/18 (2006.01)

(52) U.S. Cl.
CPC ............ *H01R 12/7076* (2013.01); *H01R 13/41* (2013.01); *H01R 43/205* (2013.01); *H05K 1/182* (2013.01); *H01R 12/7023* (2013.01); *H01R 12/75* (2013.01); *H05K 1/181* (2013.01); *H05K 2201/09063* (2013.01); *H05K 2201/10189* (2013.01)

(58) Field of Classification Search
CPC .................................................... H01R 12/7076
USPC .................................. 439/65, 78, 83
See application file for complete search history.

(56) References Cited

U.S. PATENT DOCUMENTS

| 4,526,433 | A | * | 7/1985 | Tanaka .......................... 439/301 |
| 5,702,271 | A | * | 12/1997 | Steinman ....................... 439/676 |
| 6,004,140 | A | * | 12/1999 | Kato et al. ....................... 439/65 |
| 6,974,344 | B2 | * | 12/2005 | Comerci ........................ 439/329 |
| 7,802,994 | B1 | * | 9/2010 | Chen et al. ........................ 439/65 |
| 8,714,990 | B2 | * | 5/2014 | Naito et al. ....................... 439/78 |
| 2009/0317989 | A1 | | 12/2009 | Daily et al. |
| 2009/0317990 | A1 | | 12/2009 | Mostoller et al. |

(Continued)

FOREIGN PATENT DOCUMENTS

JP 08-45622 A 2/1996
JP 2010-003688 A 1/2010

OTHER PUBLICATIONS

International Search Report (ISR) dated Oct. 18, 2011 issued in International Application No. PCT/JP2011/067830.

Primary Examiner — James Harvey
(74) Attorney, Agent, or Firm — Holtz, Holtz, Goodman & Chick PC

(57) ABSTRACT

A connector mounted on a circuit board, and fitted to a mating connector, includes a contact and a housing that holds the contact, and is inserted in an inserted portion of the circuit board. The contact is press-fitted into the housing in a direction orthogonal to a direction of inserting the housing into the inserted portion, and is held therein.

19 Claims, 29 Drawing Sheets

(56) References Cited

U.S. PATENT DOCUMENTS

| | | | |
|---|---|---|---|
| 2012/0264326 A1* | 10/2012 | Kudo et al. | 439/375 |
| 2013/0163261 A1* | 6/2013 | Shimoji et al. | 362/382 |
| 2013/0267102 A1* | 10/2013 | Shimoji | 439/65 |
| 2014/0024230 A1* | 1/2014 | Decker et al. | 439/65 |

* cited by examiner

PRIOR ART

PRIOR ART

CONNECTOR

TECHNICAL FIELD

The present invention relates to a connector.

BACKGROUND ART

Conventionally, there has been known a technique in which part of a connector assembly (connector) is inserted in an opening formed in a substrate to thereby reduce a protruding amount of the connector assembly from a mounting surface of the substrate (see PTL 1).

As shown in FIGS. 28 and 29, a connector assembly 1104 comprises one housing 1114, two contacts 1112, and two tabs 1204. Note that FIGS. 28 and 29 correspond to FIG. 5 in PTL 1 and FIG. 3 in PTL 1, respectively.

A rear end 1218 of the housing 1114 is formed with openings 1302. Further, upper slots 1502 are formed in a portion of the housing 1114 from the rear end 1218 to a side surface 1320. Further, lower slots 1510 extend in the side surface 1320 of the housing 1114 from a front end 1216 toward the rear end 1218 of the housing 1114. A terminal end of each lower slot 1510 forms a shelf portion 1512. Side surfaces 1212 and 1214 of the housing 1114, which are opposed to each other, are each formed with a protrusion 1210. The protrusion 1210 extends from the rear end 1218 of the housing 1114 to a substantially midpoint portion of the housing 1114 in a front-rear direction. The protrusion 1210 is formed with a slot (not shown). The slot extends in the front-rear direction of the housing 1114, and opens in a front end of the protrusion 1210.

Contacts 1112 each include an insertion portion 1500, a flat portion 1304, an inclined portion 1306, and a mounting portion 1308. The insertion portion 1500 is inserted into the housing 1114 through an associated one of the openings 1302. The flat portion 1304 is continuous to the insertion portion 1500, and is inserted in an associated one of the upper slots 1502. The inclined portion 1306 is continuous to the flat portion 1304. A surface of the inclined portion 1306, opposite from an inclined surface 1506, is formed with a holding barb 1508. The mounting portion 1308 is continuous to the inclined portion 1306. When the insertion portion 1500 is inserted in the associated opening 1302, the flat portion 1304 is inserted in the associated upper slot 1502, and the holding barb 1508 of the inclined portion 1306 is hooked on the shelf portion 1512. As a result, the contact 1112 is fixed to the housing 1114.

Tabs 1204 each include an insertion portion 1514, a mounting surface 1208, and a bent portion 1206. The insertion portion 1514 includes holding barbs 1516. The bent portion 1206 is provided between the insertion portion 1514 and the mounting surface 1208. When the insertion portion 1514 is inserted into the slot of an associated one of the protrusions 1210 of the housing 1114, the holding barbs 1516 are hooked on an inner surface of the slot. As a result, the tab 1204 is fixed to the housing 1114.

To mount the connector assembly 1104 on a circuit board 1118, first, the housing 1114 of the connector assembly 1104 is inserted into an opening 1116 of the circuit board 1118 from the front end 1216 thereof, the mounting portions 1308 of the contacts 1112 are placed on contact pads 1312 of the circuit board 1118, respectively, and the mounting surfaces 1208 of the tabs 1204 are placed on mounting pads 1314 of the circuit board 1118, respectively.

Then, the mounting portions 1308 of the contacts 1112 are soldered to the contact pads 1312, respectively, and the mounting portions 1208 of the tabs 1204 are soldered to the mounting pads 1314, respectively.

By the above-described operations, the connector assembly 1104 is mounted on the circuit board 1118.

CITATION LIST

Patent Literature

[PTL 1]: Japanese Laid-Open Patent Publication (Kokai) No. 2010-3688 (paragraphs 0010 to 0018, FIGS. 3 and 5)

SUMMARY OF THE INVENTION

Technical Problem

Assuming that the above-described connector assembly 1104 is to be placed on the circuit board 1118 using an automatic mounter (not shown), it is difficult to reliably and easily suck the connector assembly 1104, because the rear end 1218 of the housing 1114 has the openings 1302 and the upper slots 1502, which narrows an area which can be sucked by a suction nozzle of the automatic mounter.

The present invention has been made in view of these circumstances, and an object thereof is to make it possible to reliably and easily place a connector on a circuit board using an automatic mounter.

Solution of Problem

To solve the above problem, the present invention includes a contact, and a housing that holds the contact and is inserted in an inserted portion of a circuit board, wherein the connector is mounted on the circuit board, and is fitted to a mating connector, characterized in that the contact is press-fitted into the housing in a direction orthogonal to a direction of inserting the housing into the inserted portion, and is held therein.

Preferably, the contact includes a holding portion which is held by the housing, a contact portion which is continuous to the holding portion and is brought into contact with a mating contact of the mating connector, and a connection portion which is continuous to the holding portion and is connected to a mounting surface of the circuit board, and the housing includes a housing body which is inserted into the inserted portion, and a flange portion which is continuous to a rear end portion of the housing body in the inserting direction and is opposed to the mounting surface.

Preferably, the flange portion is provided on the rear end portion of the housing body along an entire circumference thereof.

Preferably, the contact includes a rocking suppression portion which is continuous to the holding portion and is held by the housing.

Preferably, the housing body has an accommodating portion formed in a front part or a rear part thereof, for accommodating a lock portion of the mating connector, the accommodating portion extends along the inserting direction, a front end portion of the accommodating portion opens forward of the housing body in the inserting direction, and a rear end portion of the accommodating portion is received in the inserted portion; and the accommodating portion has an engaged portion formed therein for being engaged with the lock portion of the mating connector.

Preferably, the housing has openings formed therein for causing part of the contact to be exposed upward of the circuit board.

Effects of the Invention

According to the present invention, it is possible to reliably and easily place a connector on a circuit board using an automatic mounter.

BEST MODE FOR CARRYING OUT THE INVENTION

Hereafter, a connector according to an embodiment of the present invention will be described with reference to the drawings.

Figure 1:
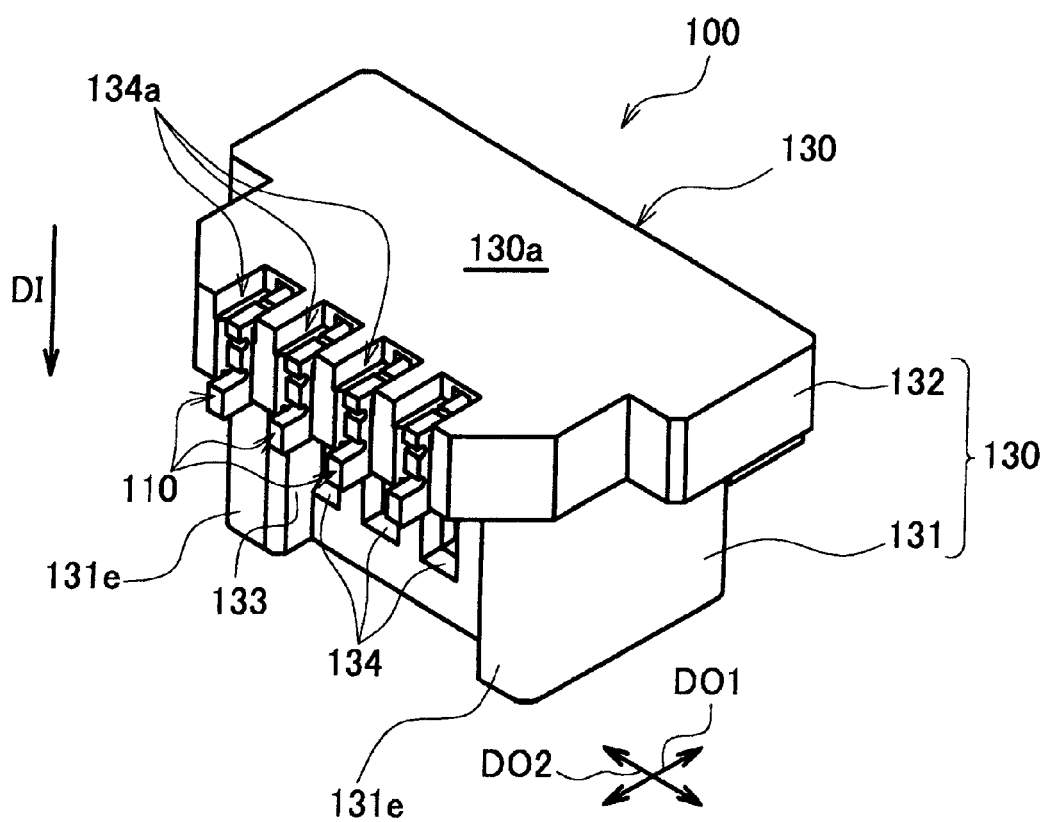
FIG. 1 is a perspective view of a connector according to one embodiment of the present invention, as taken obliquely from above.
Figure 2:
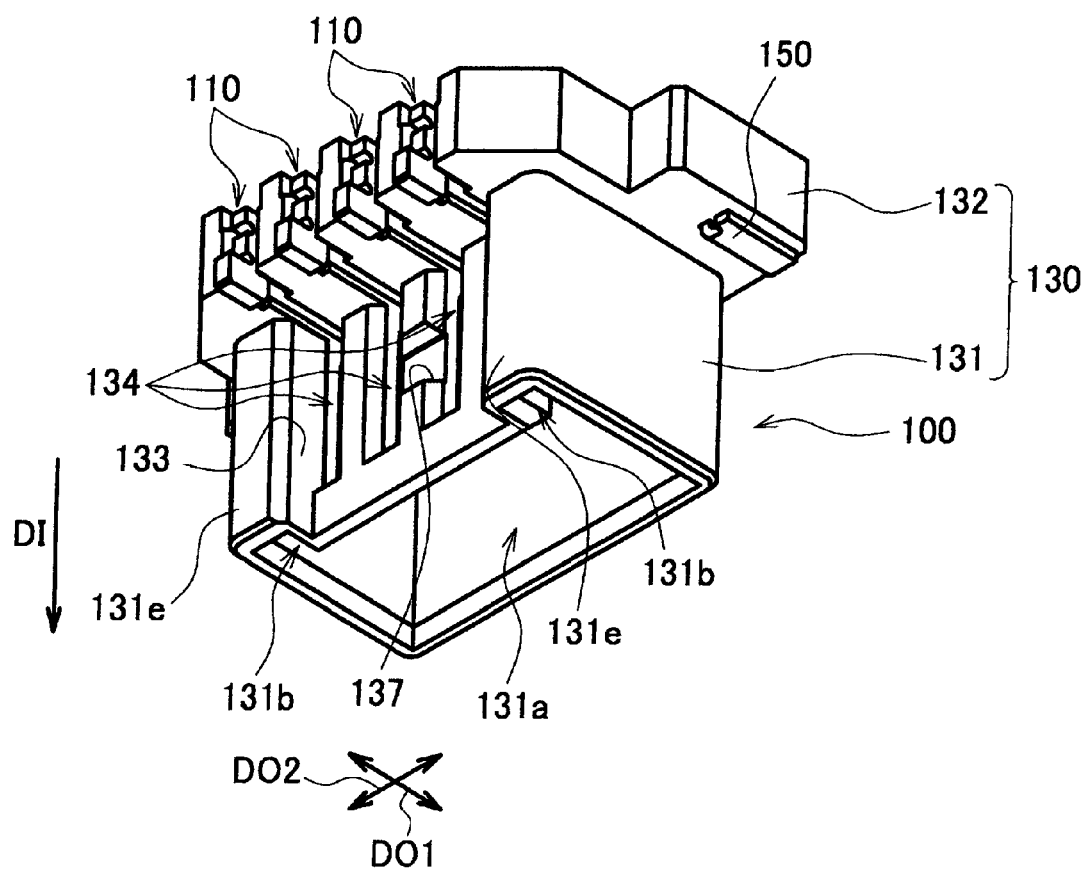
FIG. 2 is a perspective view of the connector shown in FIG. 1, as taken obliquely from below.
Figure 3:
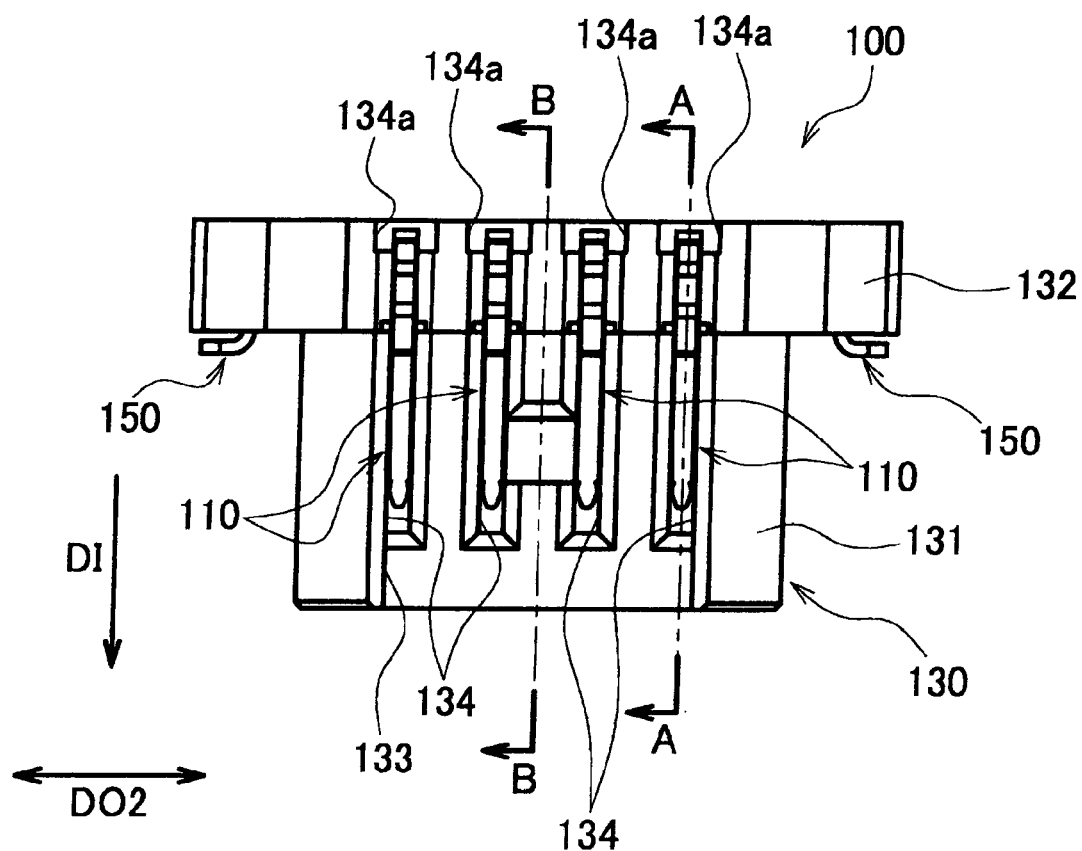
FIG. 3 is a front view of the connector shown in FIG. 1.
Figure 4:
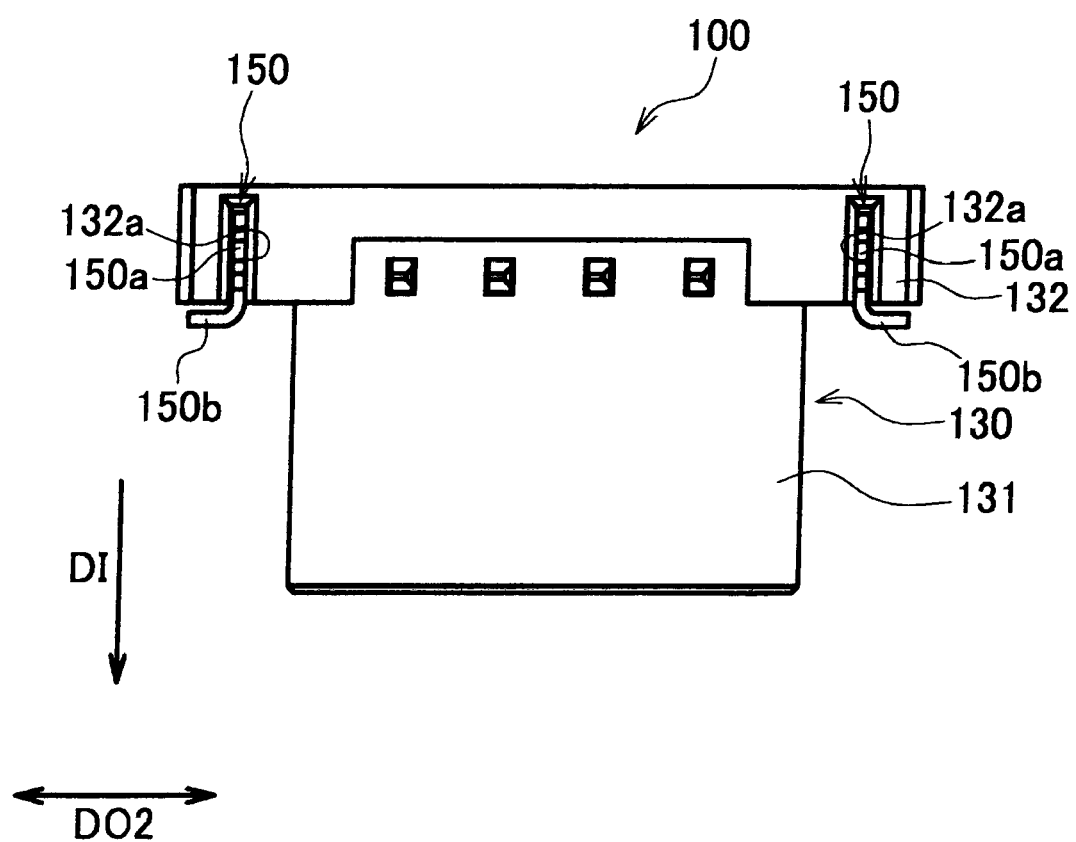
FIG. 4 is a rear view of the connector shown in FIG. 1.
Figure 5:
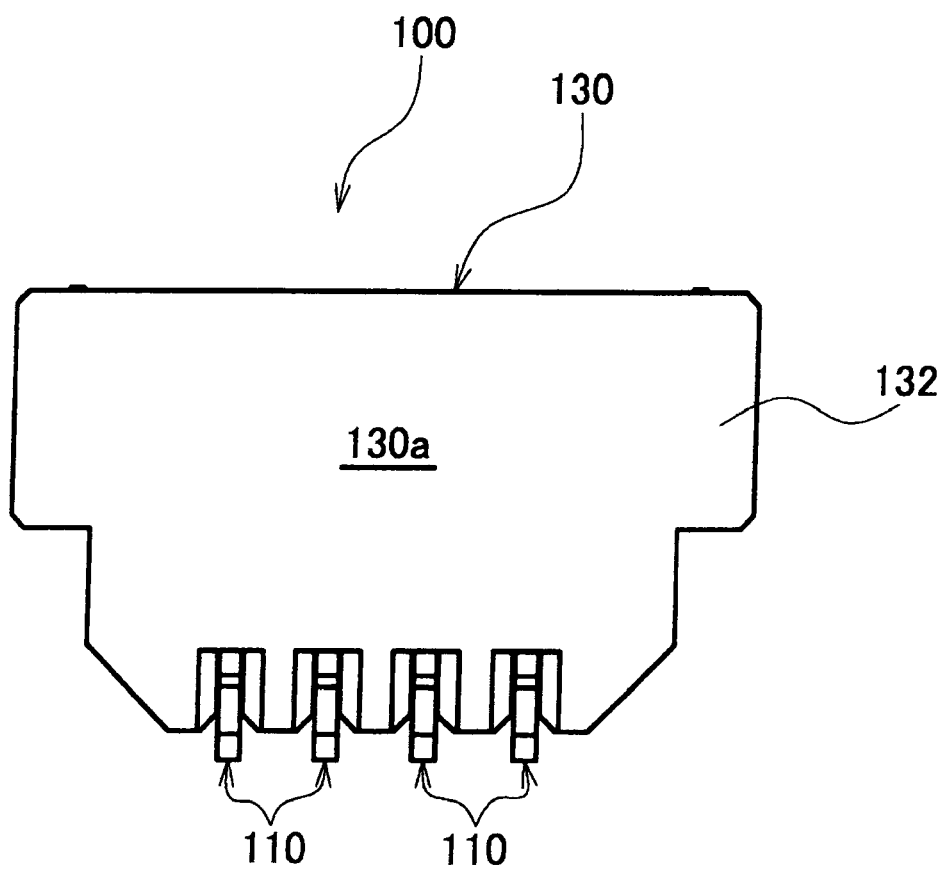
FIG. 5 is a plan view of the connector shown in FIG. 1.
Figure 6:
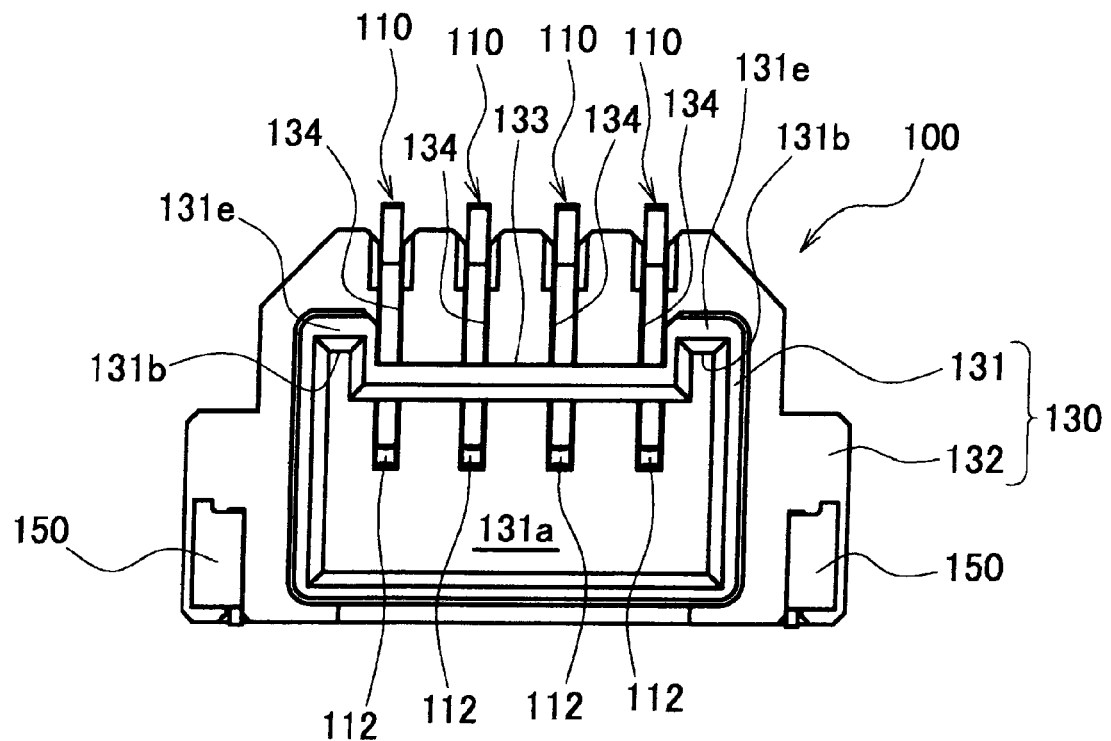
FIG. 6 is a bottom view of the connector shown in FIG. 1.
Figure 7:
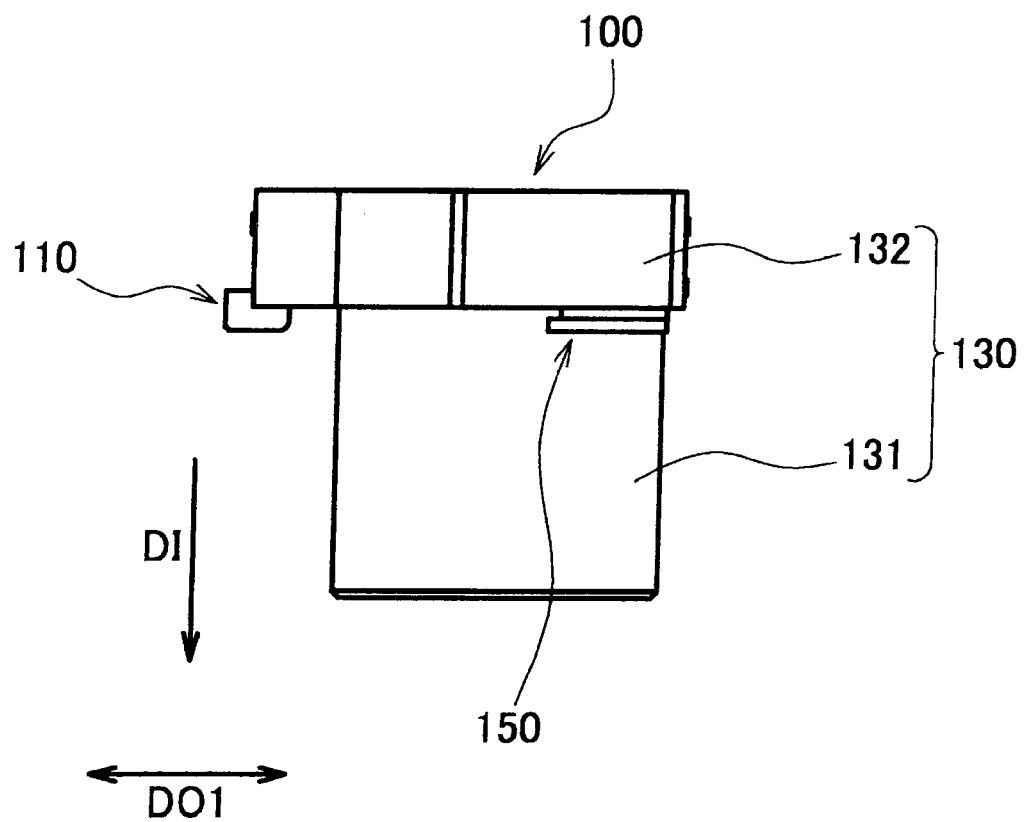
FIG. 7 is a side view of the connector shown in FIG. 1.

As shown in FIGS. 1 and 2, a connector 100 comprises four contacts 110, one housing 130, and two holddowns 150. As shown in FIGS. 17 to 20, the connector 100 is mounted on a mounting surface 502 of a printed circuit board (circuit board) 500 together with an LED 700, and is connected to a cable connector (mating connector) 300 on a surface 503 of the printed circuit board 500, which is opposite from the mounting surface 502. With this arrangement, power is supplied to the LED 700 from a power source (not shown) connected to a cable 350.

Figure 8:
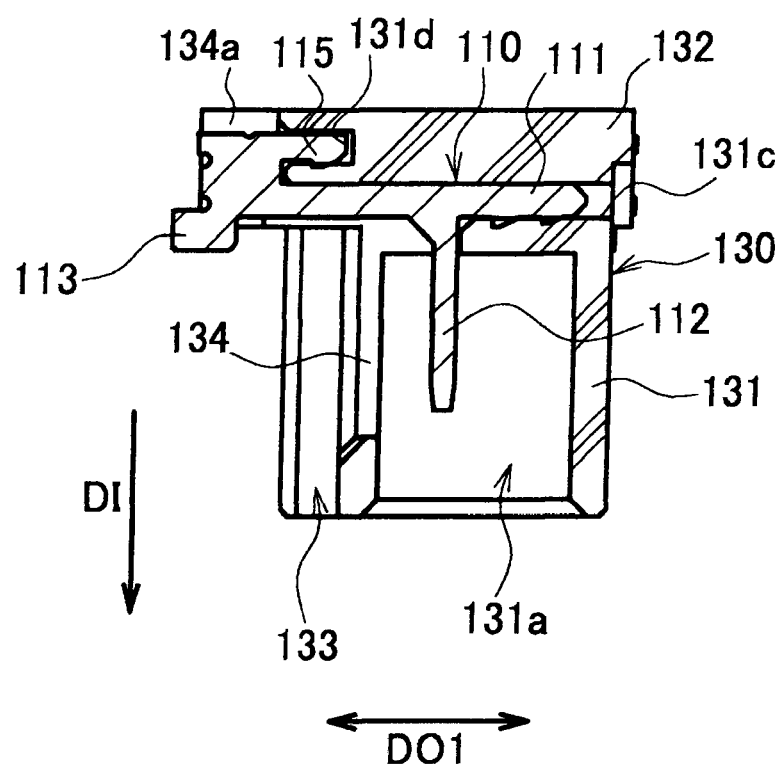
FIG. 8 is a cross-sectional view taken along A-A in FIG. 3.
Figure 9:
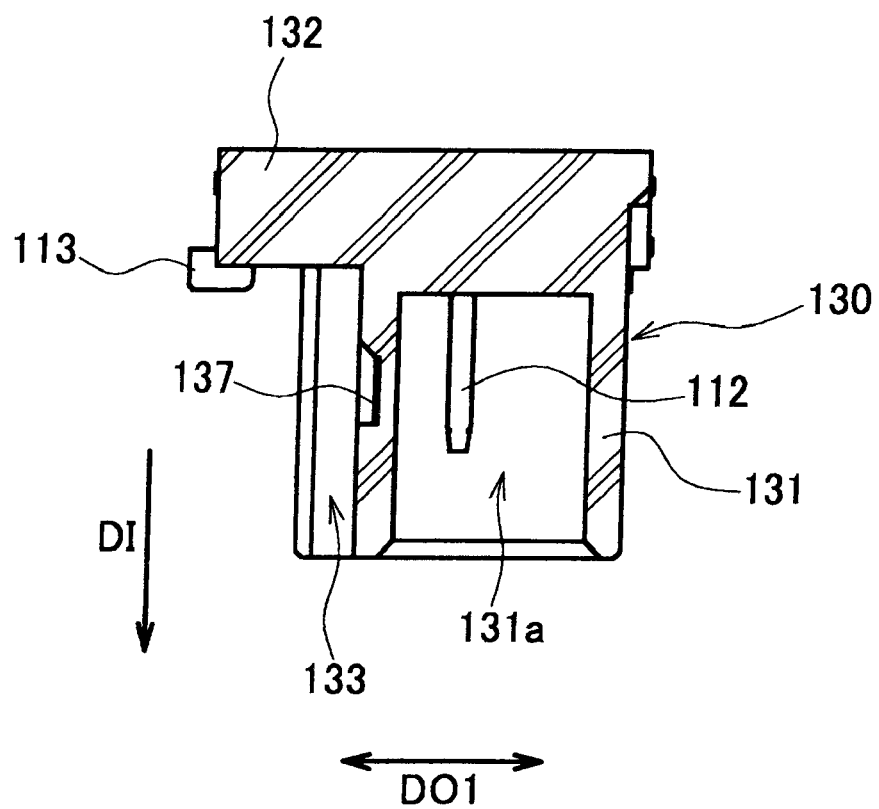
FIG. 9 is a cross-sectional view taken along B-B in FIG. 3.
Figure 10:
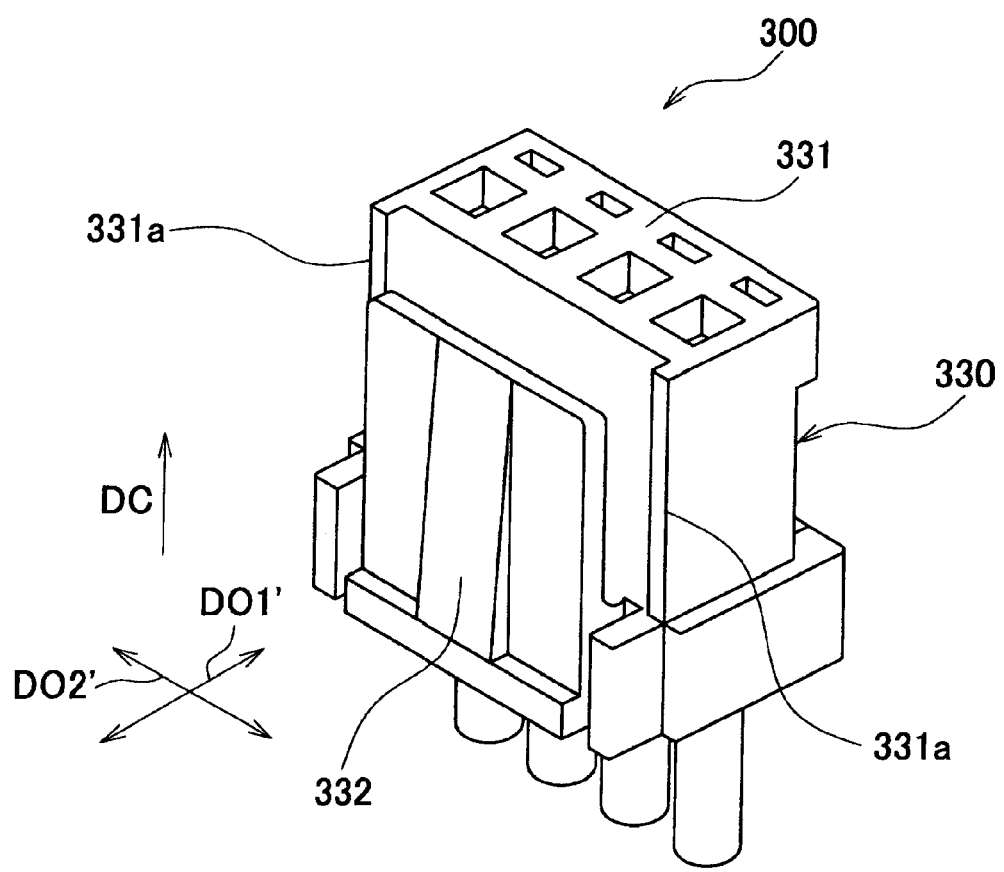
FIG. 10 is a perspective view of a cable connector which is connected to the connector shown in FIG. 1.
Figure 11:
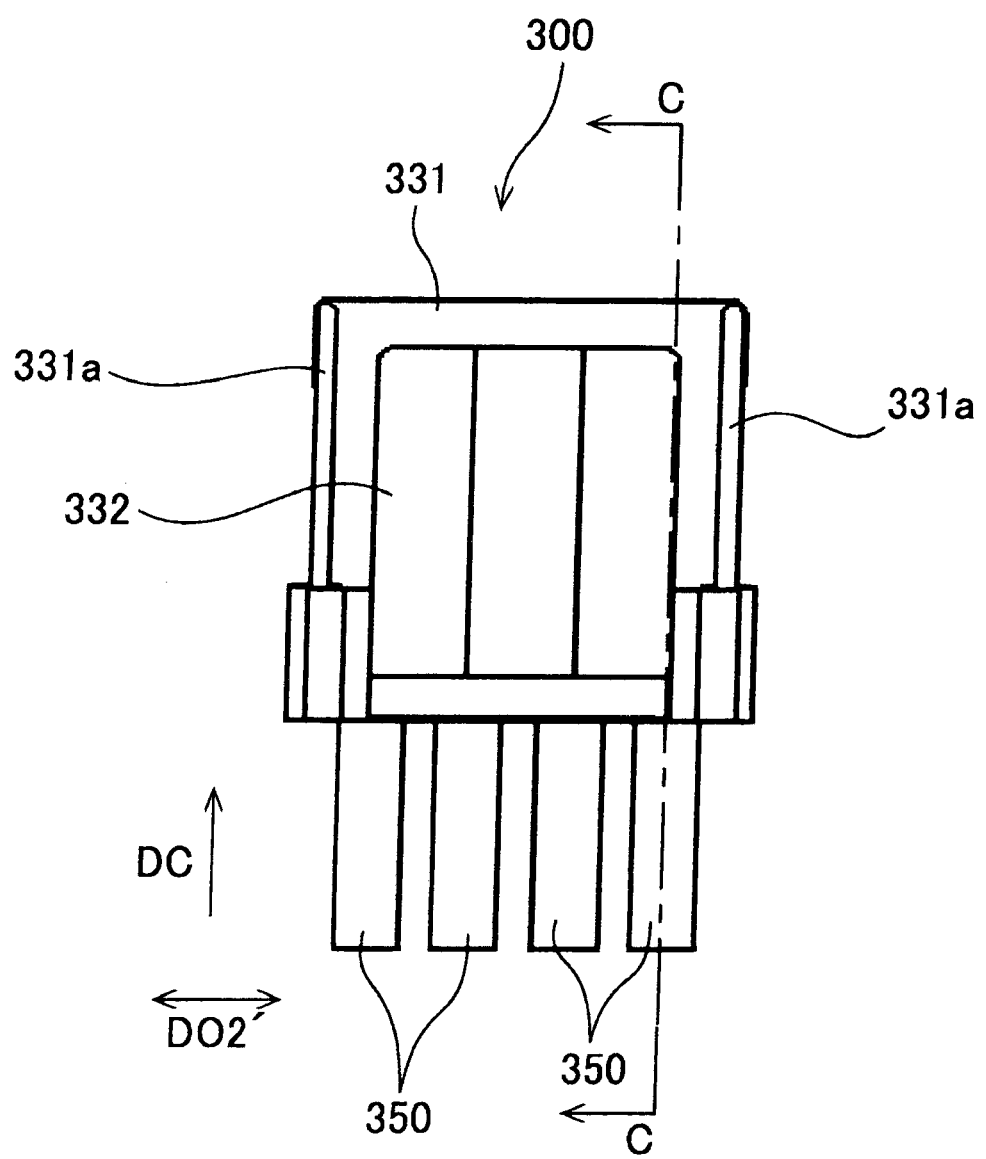
FIG. 11 is a front view of the cable connector shown in FIG. 10.
Figure 12:
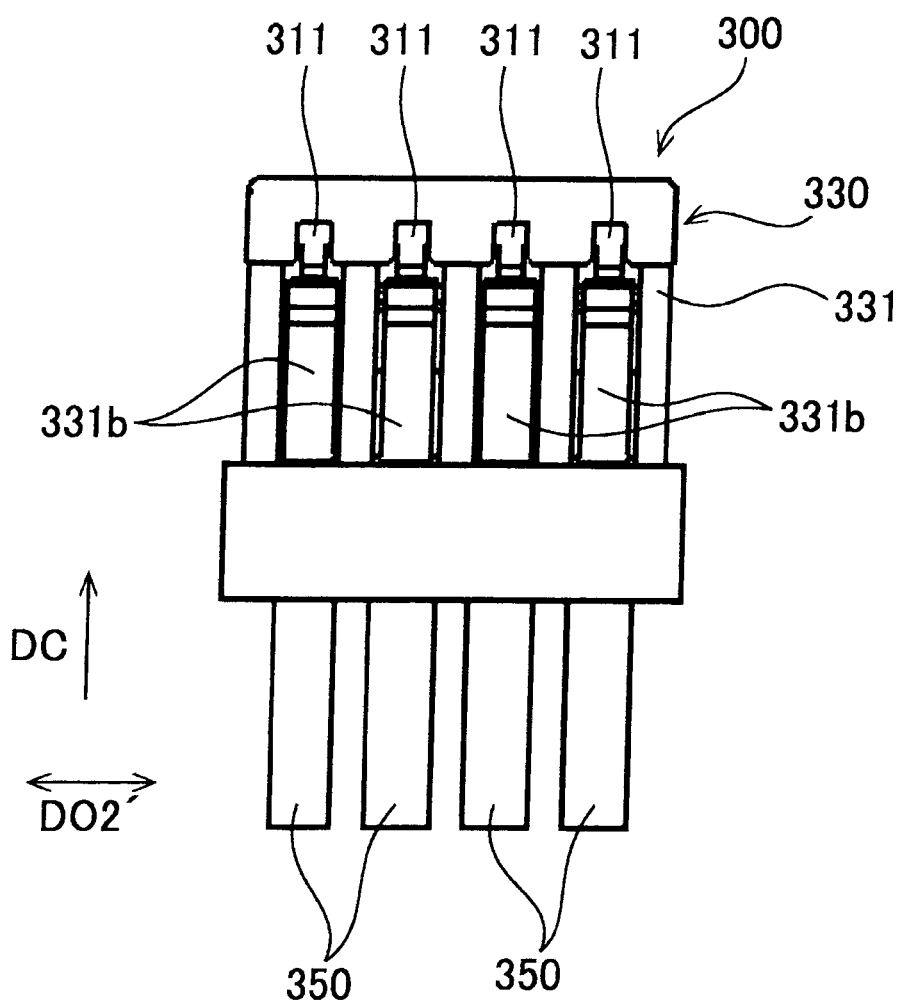
FIG. 12 is a rear view of the cable connector shown in FIG. 10.
Figure 13:
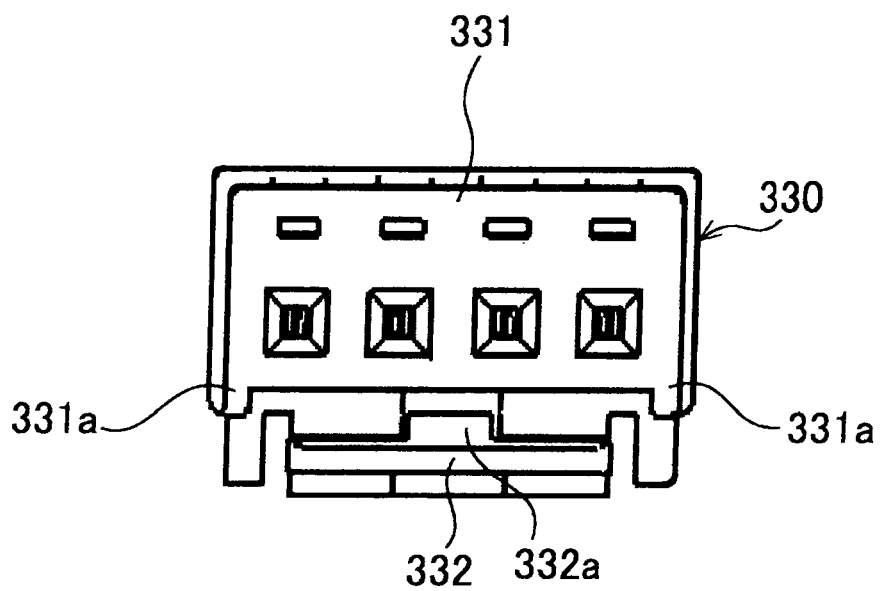
FIG. 13 is a plan view of the cable connector shown in FIG. 10.
Figure 14:
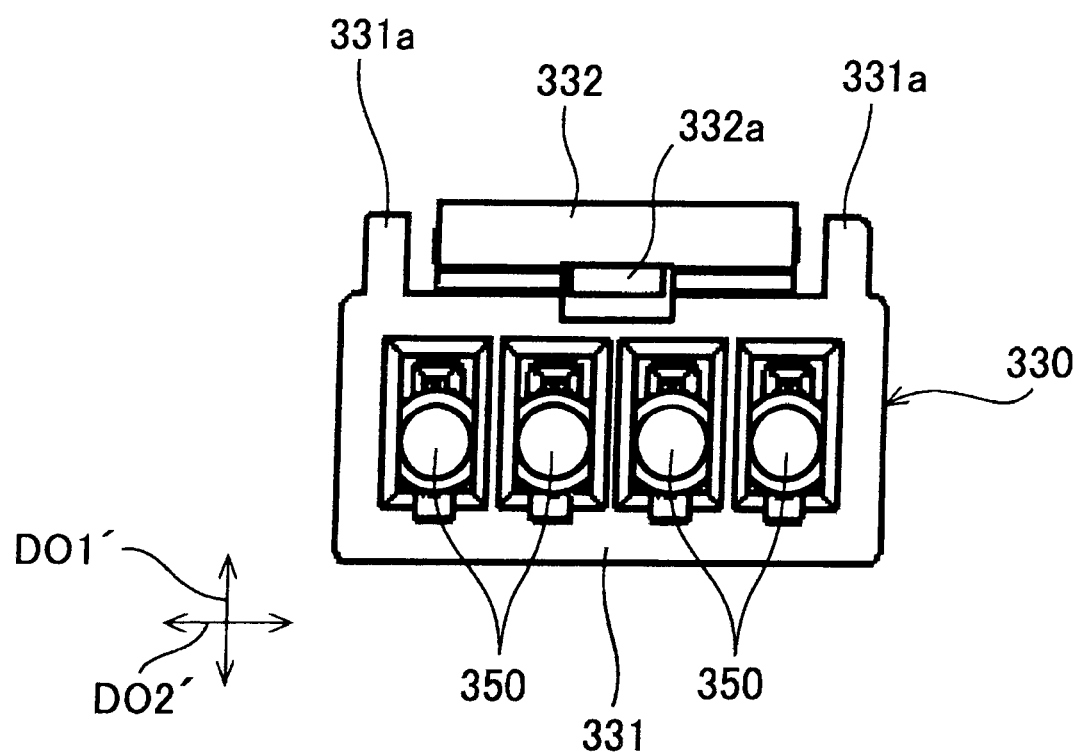
FIG. 14 is a bottom view of the cable connector shown in FIG. 10.
Figure 15:
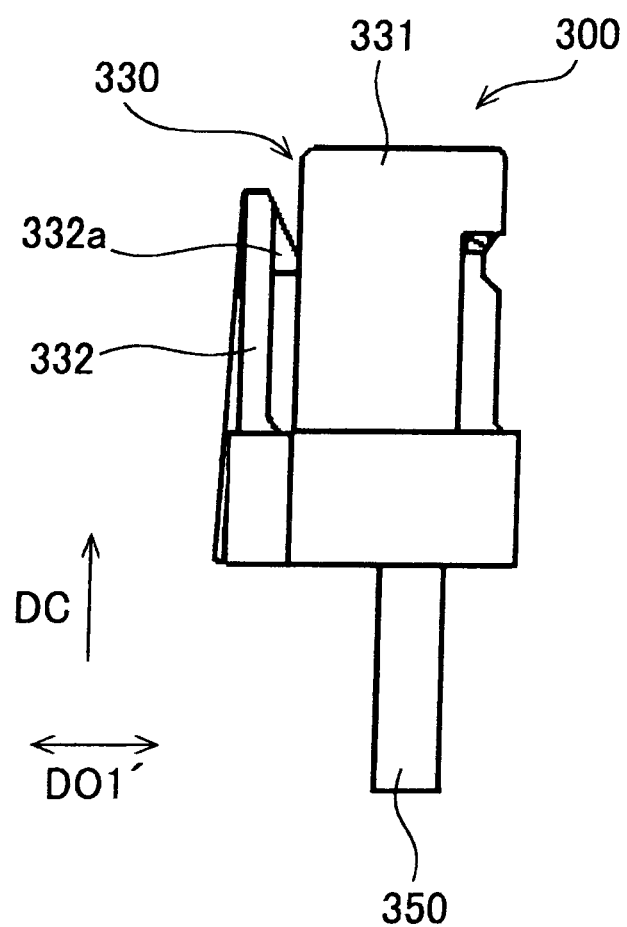
FIG. 15 is a side view of the cable connector shown in FIG. 10.

The contacts 110 are formed by blanking a conductive metal plate. As shown in FIG. 8, each contact 110 includes a press-fitting portion (holding portion) 111, a contact portion 112, a connection portion 113, and a rocking suppression portion 115. The press-fitting portion 111 is substantially pin-shaped. The contact portion 112 is continuous to the press-fitting portion 111, and extends in a direction substantially at right angles to the press-fitting portion 111. The connection portion 113 is continuous to the press-fitting portion 111, and the rocking suppression portion 115 is continuous to the press-fitting portion 111.

As shown in FIGS. 21 to 27, the housing 130 is inserted in 501 (an inserted portion) of the printed circuit board 500.

As shown in FIGS. 3 to 7, the housing 130 includes a housing body 131 and a flange portion 132. Four slits 134 are formed in a front surface of the housing 130. The slits 134 extend from an upper surface of the flange portion 132 to a lower part of the housing body 131. The slits 134 permit the contacts 110 to be inserted into the housing body 130, and accommodate the contacts 110. Each slit 134 has an upper end larger in width than the other portion thereof, and the upper end of the slit 134 forms an opening 134a. The opening 134a causes part of the rocking suppression portion 115 of the contact 110 to be exposed upward therefrom. Note that the upper portions of the slits 134 are the upper portions of the slits 134, as viewed in FIG. 3.

An upper end portion of the housing body 131 (rear end portion of the housing body 131 in a direction DI of inserting the housing body 131) protrudes from the mounting surface 502 of the printed circuit board 500. Further, a lower portion of the housing body 131 protrudes from the surface 503 of the printed circuit board 500 opposite from the mounting surface 502 (see FIGS. 24 and 25). Note that the upper portion of the housing 130 is the upper portion of the housing 130, as viewed in FIG. 3.

The housing body 131 includes a receiving portion 131a. The receiving portion 131a receives the cable connector 300 therein. A front surface of the housing body 131 has an engaged portion 137 formed in a central portion thereof (see FIG. 2). Two protruding portions 131e are formed on opposite sides of the front surface of the housing body 131 (see FIGS. 1, 2, and 6). The two protruding portions 131e each extend in the inserting direction DI, and an accommodating portion 133 is formed between the two protruding portions 131e. An upper portion of the accommodating portion 133 is received in the hole 501 of the printed circuit board 500 (see FIG. 25), and a lower end of the accommodating portion 133 is open into a space under the printed circuit board 500 so as to be capable of receiving therein a lock portion 332 of the cable connector 300. The two protruding portions 131e are each formed with a groove 131b communicated with the receiving portion 131a. The groove 131b extends in the inserting direction DI. The upper portion of the housing body 131 has press-fitting holes 131c formed in a portion toward the rear surface thereof (see FIG. 8). Each press-fitting hole 131c extends in a direction DO1 orthogonal to the inserting direction DI. One ends of the press-fitting portions 111 of the contacts 110 are press-fitted in the press-fitting holes 131c, respectively. The upper portion of the housing body 131 has press-fitting holes 131d formed in a portion toward the front surface thereof (see FIG. 8). The press-fitting hole 131d extends in the direction DO1 orthogonal to the inserting direction DI. The rocking suppression portions 115 of the contacts 110 are press-fitted in the press-fitting hole 131d. Note that the rear surface of the housing body 131 is a right side as viewed in FIG. 8, and the front surface of the same is a left side as viewed in FIG. 8.

The flange portion 132 is formed on an outer peripheral surface of the upper end portion of the housing body 131 along the entire circumference thereof. The flange portion 132 is opposed to the hole 501 of the printed circuit board 500, and covers the hole 501. The flange portion 132 has grooves 132a formed in a rear surface thereof (see FIG. 4).

Each holddown 150 is formed by blanking and bending a conductive metal plate. The holddown 150 includes a press-fitting portion 150a and a leg portion 150b. The press-fitting portion 150a is press-fitted into an associated one of the grooves 132a of the flange portion 132. The leg portion 150b is continuous to the press-fitting portion 150a, and is bent substantially at right angles to the press-fitting portion 150a.

As shown in FIGS. 10 to 16, the cable connector 300 comprises four contacts (mating contacts) 310 and one housing 330.

Figure 16:
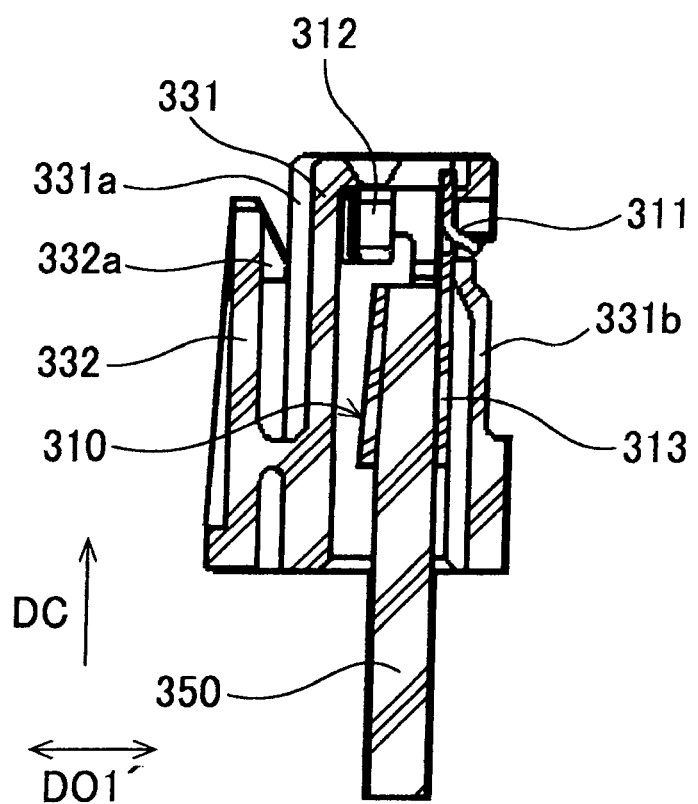
FIG. 16 is a cross-sectional view taken along C-C in FIG. 11.
Figure 17:
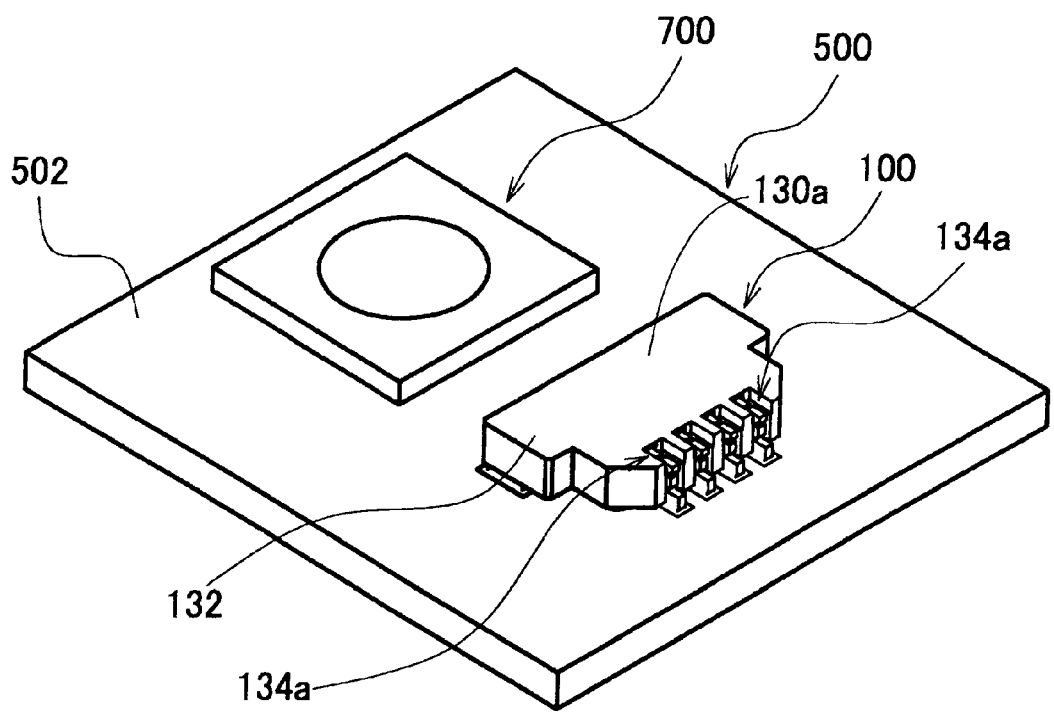
FIG. 17 is a perspective view showing a state in which the connector shown in FIG. 1 is mounted on a printed circuit board.
Figure 18:
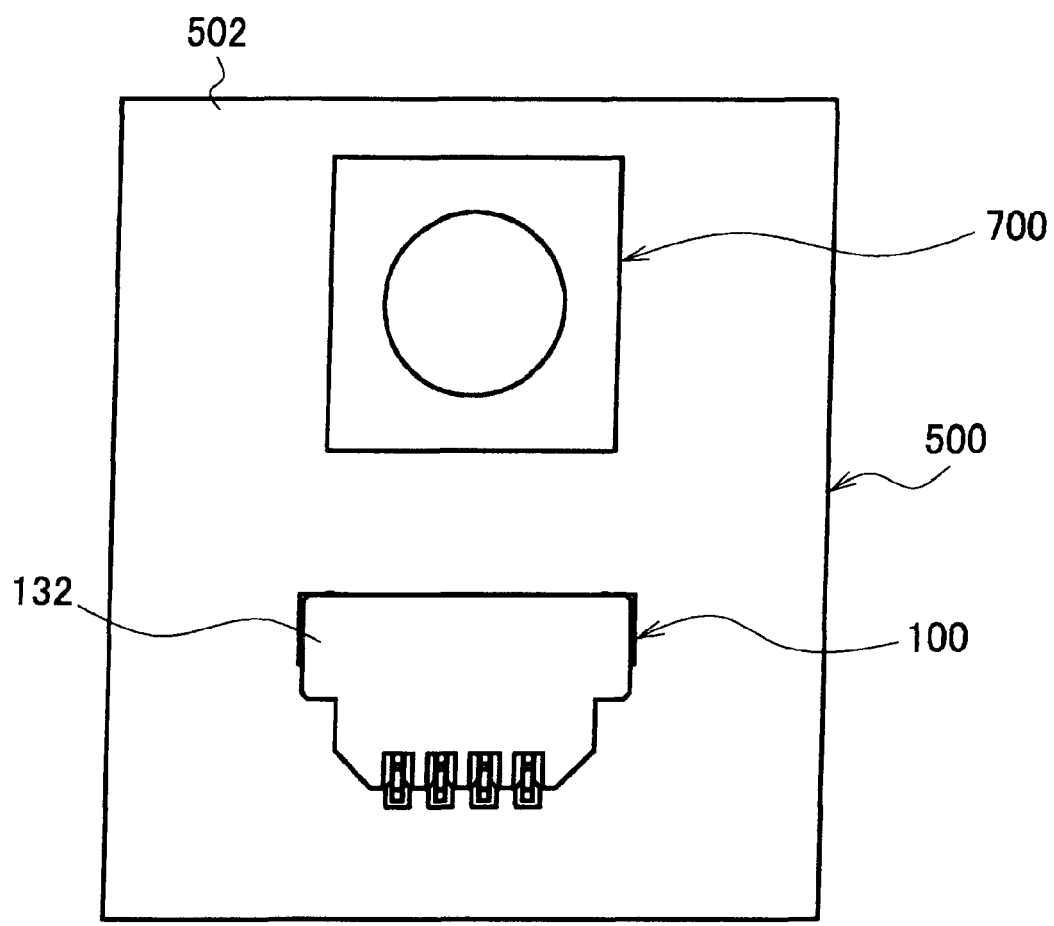
FIG. 18 is a plan view showing the state in which the connector shown in FIG. 1 is mounted on the printed circuit board.
Figure 19:
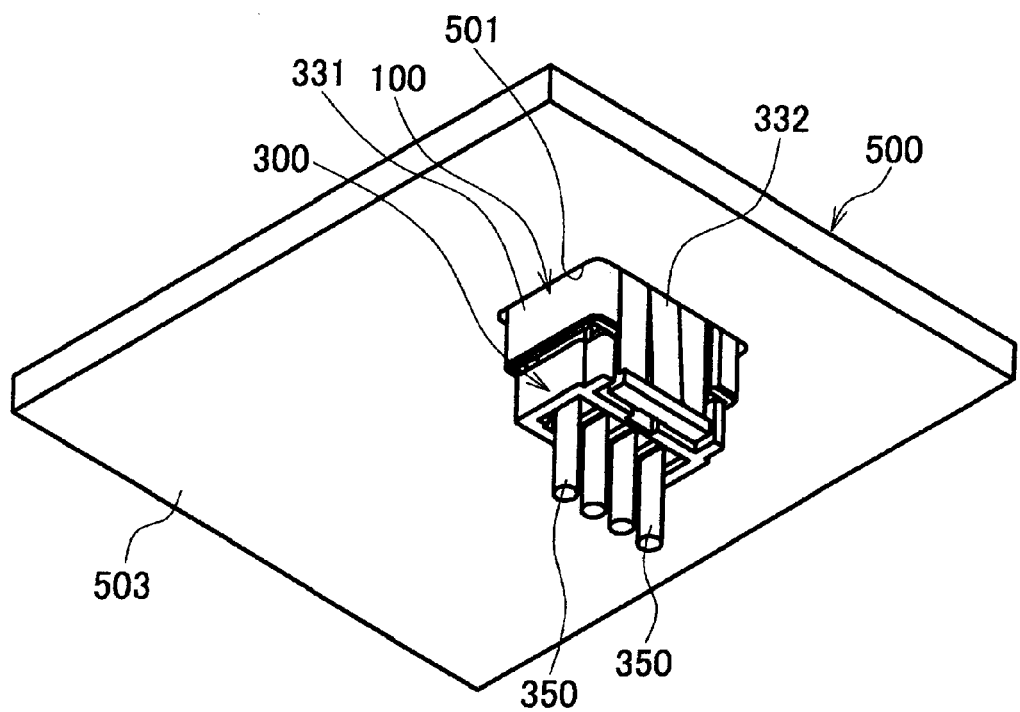
FIG. 19 is a perspective view showing a state in which the cable connector is connected to the connector mounted on the printed circuit board.

Each contact 310 includes a protruding piece portion 311, a contact portion 312, and a wire connection portion 313 (see FIG. 16). The protruding piece portion 311 is located at a front end of the contact 310. The contact portion 312 is located at the front end of the contact 310, and receives the contact portion 112 of an associated one of the contacts 110 of the connector 100 therein, and is brought into contact with the contact portion 112. The wire connection portion 313 is continuous to the contact portion 312, and is connected to the cable 350.

The housing 330 is formed of a synthetic resin having elasticity, and includes a housing body 331 and the lock portion 332. The housing body 331 accommodates and holds the four contacts 310. The housing body 331 has two keys 331a formed on opposite sides of a front surface thereof (see FIGS. 10 and 11). The keys 331a extend along a direction DC of fitting the cable connector 300 to the connector 100. The keys 331a are inserted in the grooves 131b of the housing 130 of the connector 100, respectively. The keys 331a and the grooves 131b of the connector 100 can prevent the cable connector 300 from being erroneously fitted to the connector 100. The rear surface of the housing body 331 is formed with four lances 331b (see FIGS. 12 and 16). The protruding piece portions 311 of the contacts 310 are caught in the lances 331b, respectively, whereby the contacts 310 are fixed to the housing body 331.

The lock portion 332 is integrally formed with the housing body 331, and can move like a seesaw (see FIG. 16). The lock portion 332 has a lug 332a formed on a front end thereof. When the cable connector 300 is connected to the connector 100, the lock portion 332 of the cable connector 300 is accommodated in the accommodating portion 133 of the housing 130 of the connector 100.

To mount the connector 100 on the printed circuit board 500, first, an upper surface 130a (see FIGS. 1 and 5) of the housing 130 is sucked by a suction nozzle of an automatic mounter, not shown, and the connector 100 is moved to a location above the hole 501 of the printed circuit board 500, and is inserted into the hole 501. As a result, the connection portions 113 (see FIG. 8) of the contacts 110 and the leg portions 150b (see FIG. 4) of the holddowns 150 are placed on pads (not shown) of the mounting surface 502 (see FIGS. 18, 21, 24, and 25).

The upper surface 130a of the housing 130 has only the openings 134a formed therein (see FIG. 17), and a wide area is secured which can be sucked by the suction nozzle of the automatic mounter, and hence the suction nozzle of the automatic mounter can reliably and easily suck the connector 100.

Further, if an external force is applied to the connector 100 due to some cause after the connector 100 has been inserted in the hole 501 of the printed circuit board 500, one of the side surfaces, the rear surface, and the protruding portions 131e of the housing body 131 of the connector 100 is brought into contact with an inner peripheral surface of the hole 501 to thereby prevent the connector 100 from moving, and hence this prevents the connector 100 from being displaced in the directions DO1 and DO2, which are orthogonal to the direction DI of inserting the connector 100.

Next, the connection portions 113 and the leg portions 150b are soldered to the pads on the mounting surface 502 of the printed circuit board 500 by reflow soldering. By undergoing the above-described steps, the connector 100 is mounted on the printed circuit board 500.

Figure 20:
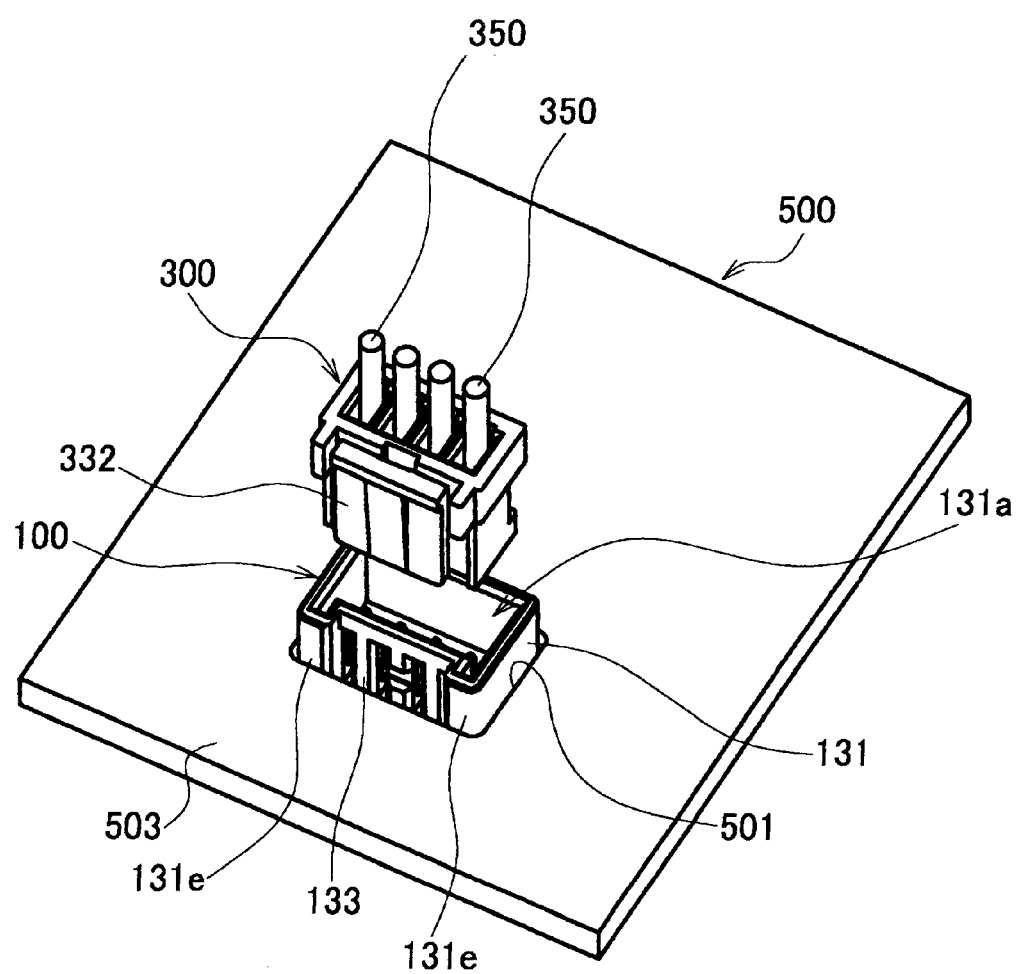
FIG. 20 is a perspective view showing a state before the cable connector is connected to the connector mounted on the printed circuit board.
Figure 21:
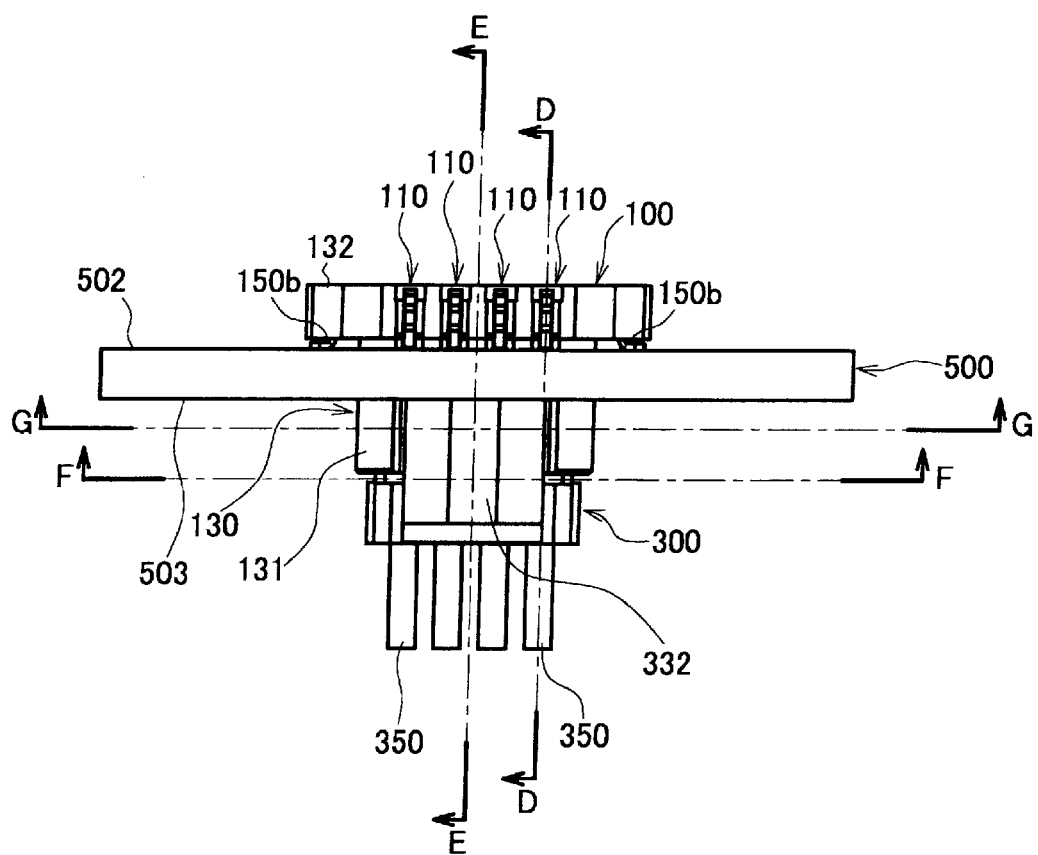
FIG. 21 is a front view showing the state in which the cable connector is connected to the connector mounted on the printed circuit board.
Figure 22:
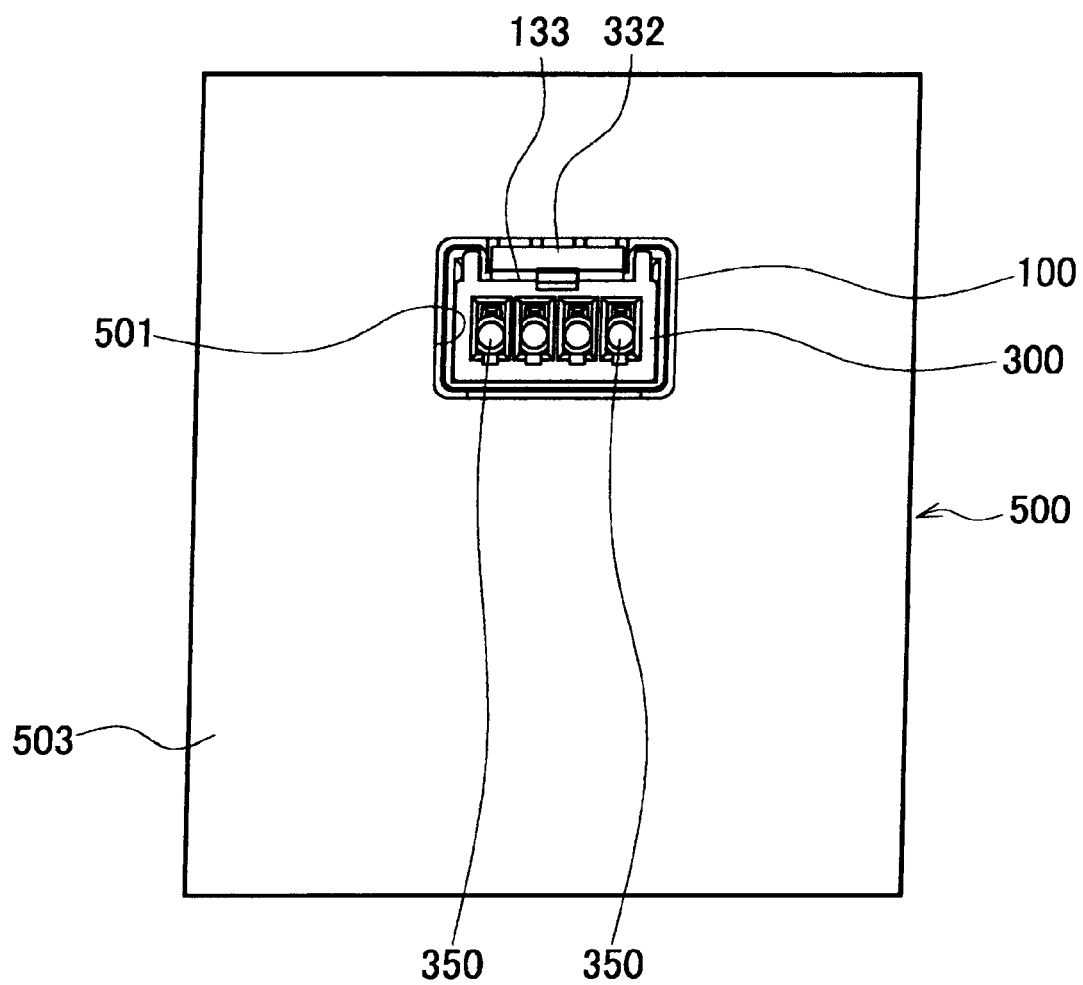
FIG. 22 is a view of the connector and the cable connector, shown in FIG. 21, as taken from the bottom of the printed circuit board.
Figure 23:
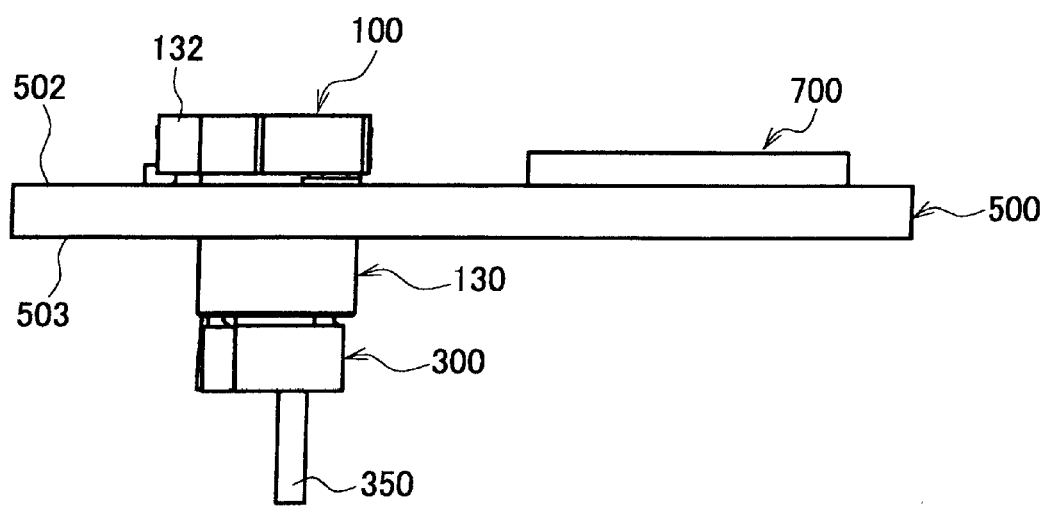
FIG. 23 is a view of the connector and the cable connector, shown in FIG. 21, as taken from a side of the printed circuit board.
Figure 24:
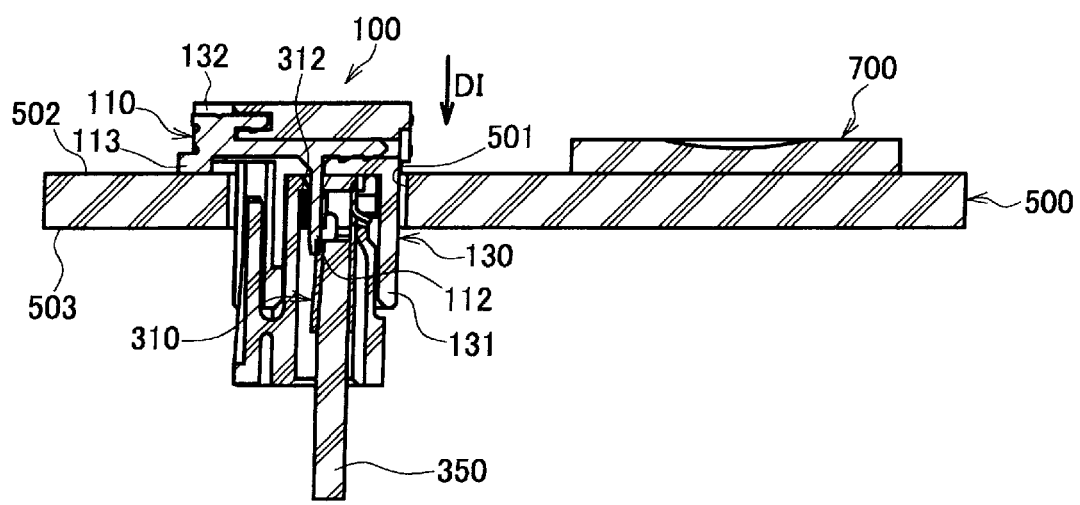
FIG. 24 is a cross-sectional view taken along D-D in FIG. 21.
Figure 25:
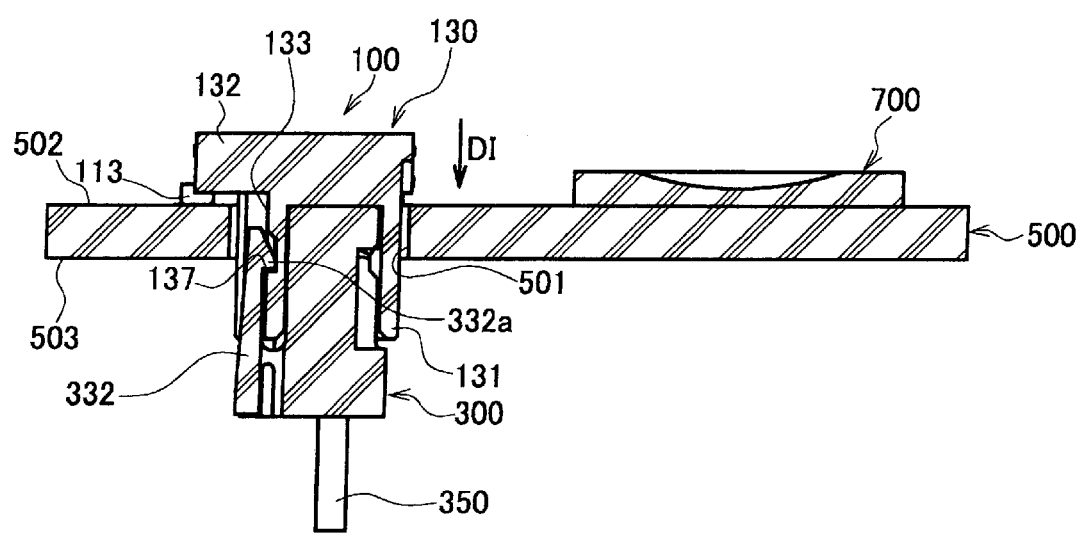
FIG. 25 is a cross-sectional view taken along E-E in FIG. 21.
Figure 26:
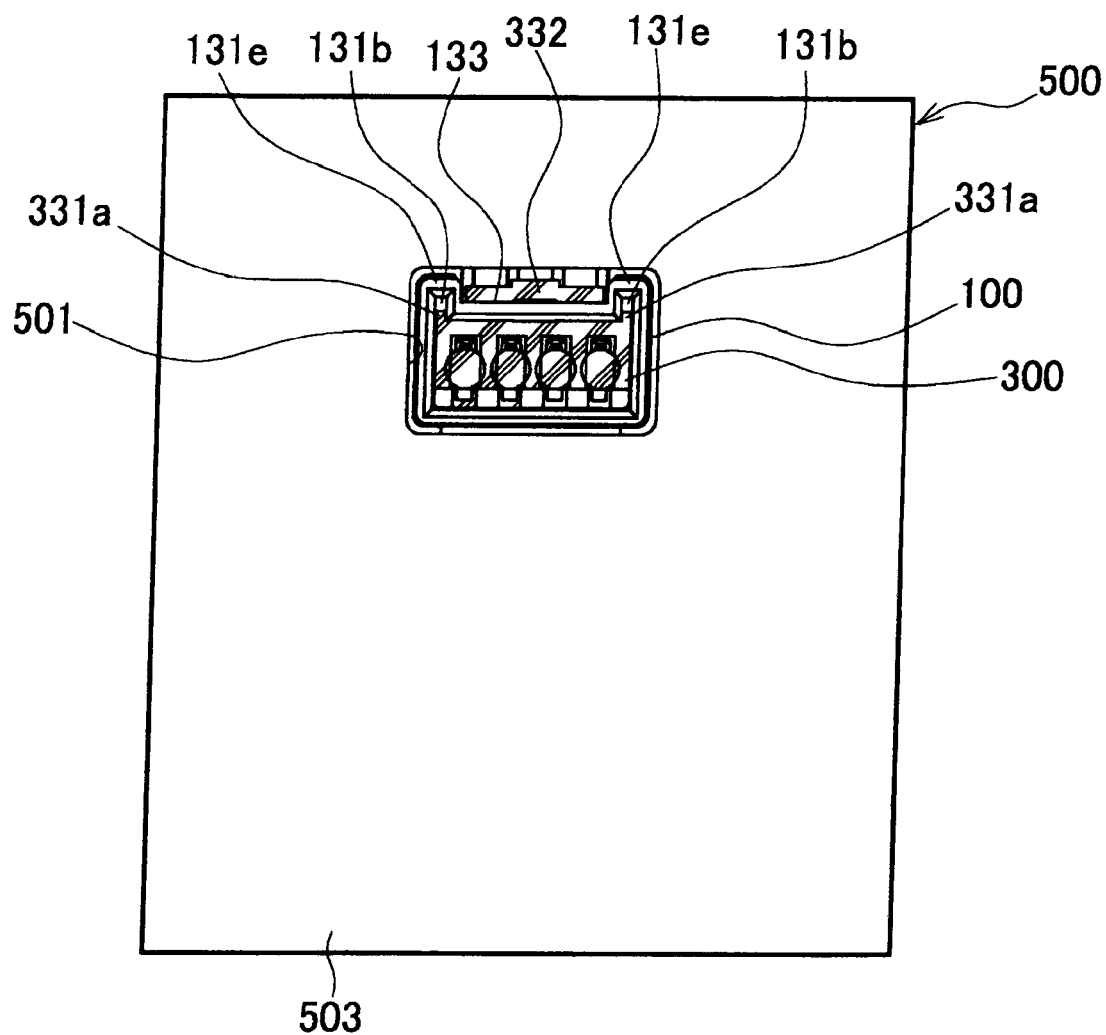
FIG. 26 is a cross-sectional view taken along F-F in FIG. 21.
Figure 27:
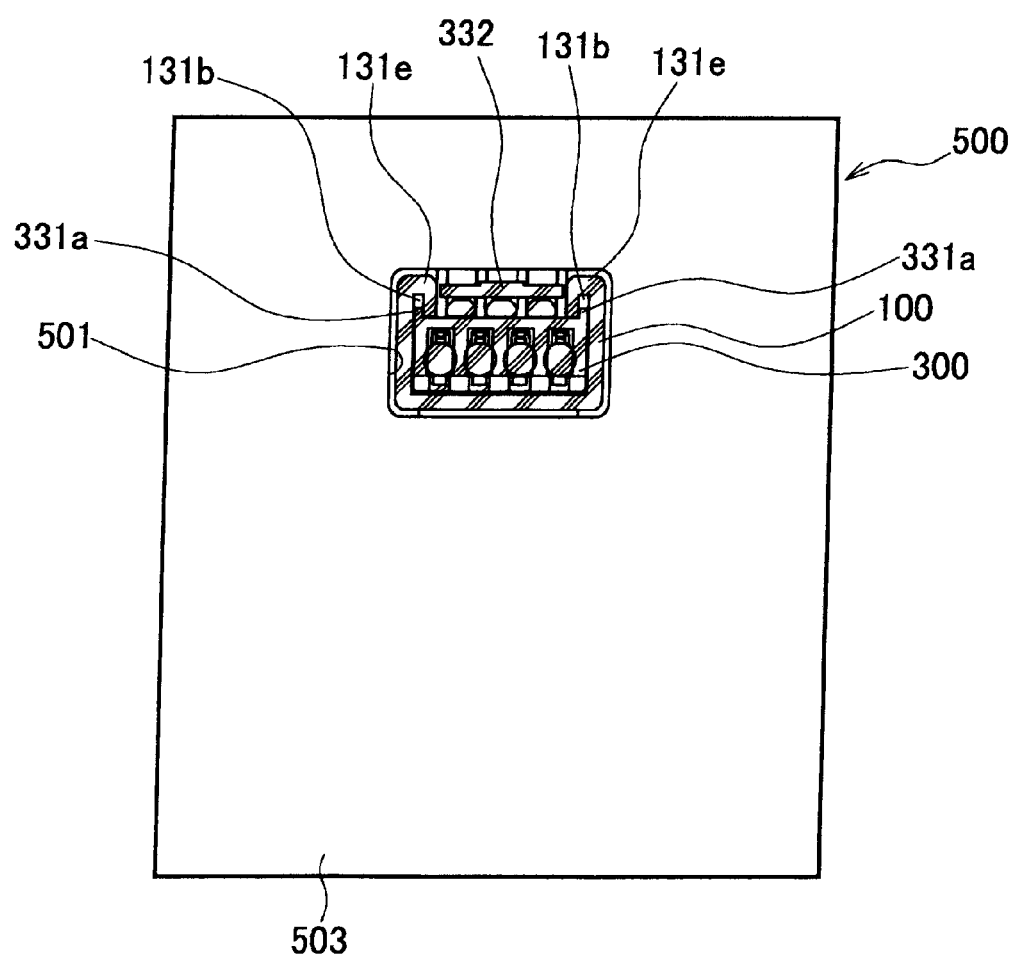
FIG. 27 is a cross-sectional view taken along G-G in FIG. 21.
Figure 28:
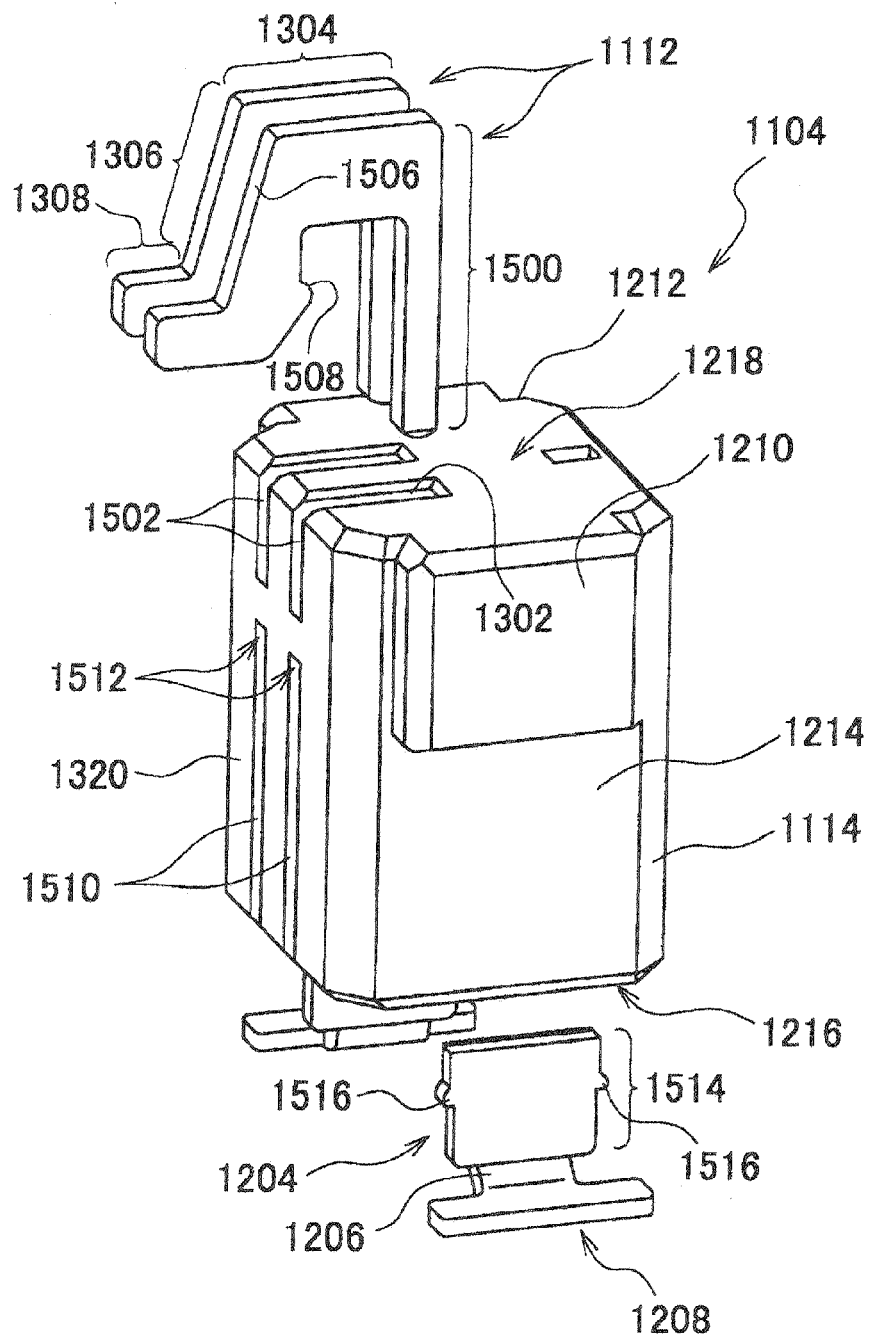
FIG. 28 is an exploded perspective view of a conventional connector assembly.
Figure 29:
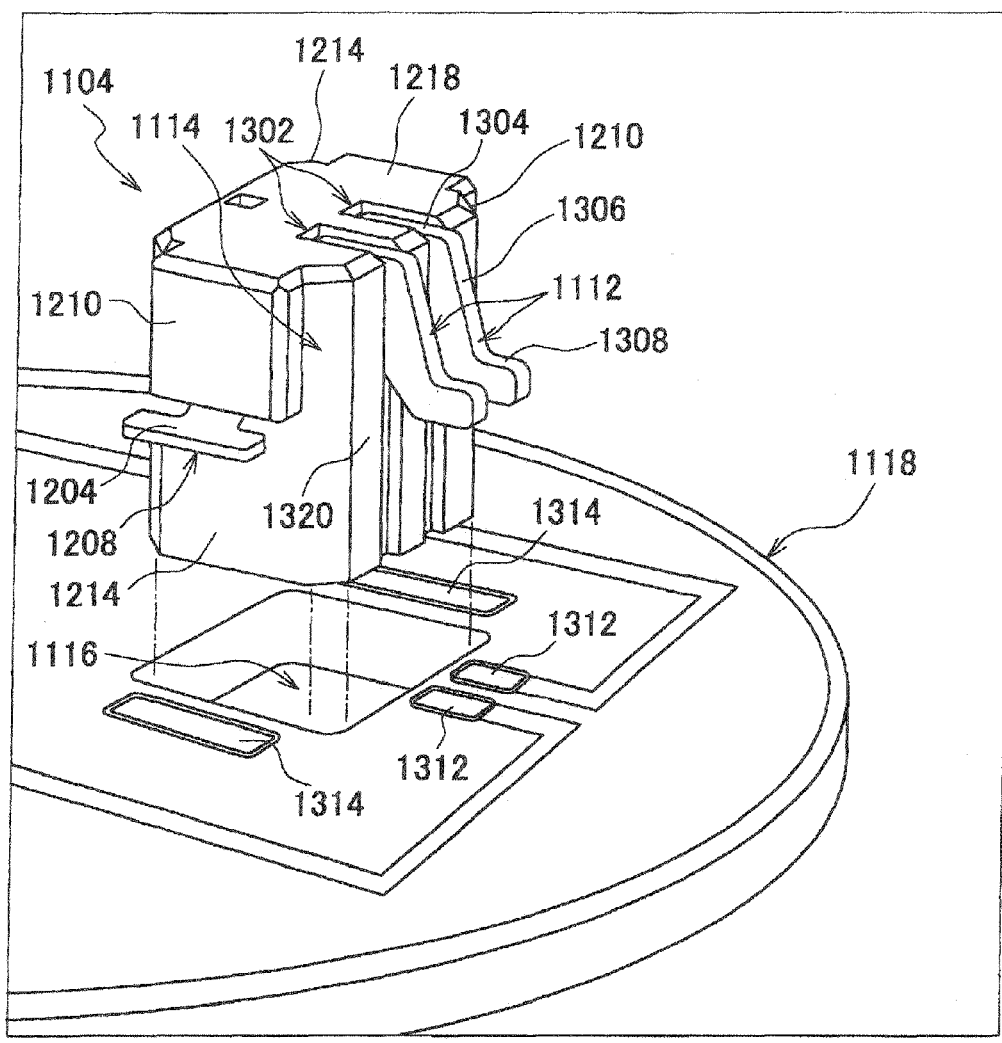
FIG. 29 is a perspective view showing a state before the connector assembly shown in FIG. 28 is mounted on a printed circuit board.

To connect the cable connector 300 to the connector 100, it is only required to insert the cable connector 300 into the receiving portion 131a of the connector 100 from the surface 503 of the printed circuit board 500 opposite from the mounting surface 502 (see FIG. 20). The lock portion 332 of the cable connector 300 is accommodated in the accommodating portion 133 (FIGS. 26 and 27), and the lug 332a of the lock portion 332 is engaged with the engaged portion 137 of the connector 100, whereby the cable connector 300 is fixed to the connector 100.

Assuming that the cable connector 300 is fitted to the connector 100 mounted on the printed circuit board 500 while moving back and forth the cable connector 300 in directions DO1' and DO2', which are orthogonal to the fitting direction DC, the connector 100 is rocked. Rocking force applied to the connector 100, caused by the movement of the cable connector 300, is not concentrated on the connection portions 113, but is also applied to the rocking suppression portions 115, and hence the rocking force applied to the connector 100 is dispersed.

In the connector 100, the rocking suppression portions 115 of the contacts 110 are exposed upward through the openings 134a, respectively, and hence it is possible to test continuity between the power source and the LED 700 by touching each exposed portion with a probe pin of an inspection device, not shown.

According to the above-described embodiment, the wide area which can be sucked by a suction nozzle of an automatic mounter is secured on the upper surface 130a of the housing 130, and hence it is possible to reliably and easily place the connector 100 on the printed circuit board 500 using an automatic mounter.

Further, since each contact 110 has the rocking suppression portion 115, even if the connector 100 receives an external force, it is possible to prevent the soldering of the connection portion 113 from being cracked.

Further, the housing 130 is provided with the accommodating portion 133, and part of the accommodating portion 133 which accommodates the lock portion 332 is received in the hole 501 of the printed circuit board 500, and hence it is possible to reduce the protruding amount of the cable connector 300 from the surface 503 of the printed circuit board 500 opposite from the mounting surface 502.

Further, since the housing 130 includes the flange portion 132, it is possible to cover the hole 501 of the printed circuit board 500 with the flange portion 132. As a result, when the printed circuit board 500 is viewed from above while the LED 700 disposed adjacent to the connector 100 is lighted, the connector 100 and its vicinity are not darkened.

Although in the above-described embodiment, the flange portion 132 is provided on the outer peripheral surface of the housing body 131 along the entire circumference thereof, the flange portion 132 may be provided on only part of the outer peripheral surface of the housing body 131.

Further, although each contact 110 includes the rocking suppression portion 115, it is not necessarily required to provide the rocking suppression portion 115 on each contact 110.

Although in the above-described embodiment, the accommodating portion 133 is formed in the front part of the housing 130, the accommodating portion 133 may be provided in the rear part of the housing 130.

Further, it is not necessarily required to provide the accommodating portion 133 in the housing 130. Further, when the accommodating portion 133 is provided in the housing 130, it is not necessarily required to provide the accommodating portion 133 such that the upper portion of the accommodating portion 133 is received in the hole 501 of the printed circuit board 500.

Although the openings 134a are formed in the upper end portion of the housing 130, the openings 134a are not necessarily required.

Further, the inserted portion is not limited to the hole 501, but for example, a cutout (not shown) may be formed as the inserted portion.

Although in the above-described embodiment, the direction DC of fitting the cable connector 300 and the direction DI of inserting the connector 100 are parallel to each other, it is not necessarily required to make the direction DC of fitting the cable connector 300 and the direction DI of inserting the connector 100 parallel to each other, but the two directions (the fitting direction DC and the inserting direction DI) may be made orthogonal to each other.

DESCRIPTION OF REFERENCE NUMERALS

100: connector, 110: contact, 111: press-fitting portion (holding portion), 112: contact portion, 113: connection portion, 115: rocking suppression portion, 130: housing, 130a: upper surface, 131: housing body, 131a: receiving portion, 131b: groove, 131c: press-fitting hole, 131d: press-fitting hole, 131e: protruding portion, 132: flange portion, 132a: groove, 133: accommodating portion, 134: slit, 134a: opening, 137: engaged portion, 150: holddown, 150a: press-fitting portion, 150b: leg portion, 300: cable connector (mating connector), 310: contact (mating contact), 311: protruding piece portion, 312: contact portion, 313: wire connection portion, 330: housing, 331: housing body, 331a: key, 331b: lance, 332: lock portion, 332a: lug, 350: cable, 500: printed circuit board (circuit board), 501: hole (inserted portion), 502: mounting surface, 503: surface opposite from mounting surface, 700: LED, DI: inserting direction, DO1, DO2: directions orthogonal to inserting direction DI, DC: fitting direction, DO1', DO2': directions orthogonal to fitting direction DC

The invention claimed is:

1. A connector comprising:
   a contact; and
   a housing that holds said contact and is insertable in an inserted portion of a circuit board,
   wherein the connector is mountable on the circuit board, and is fittable to a mating connector, and
   wherein said contact is press-fitted into said housing in a direction orthogonal to a direction of inserting said housing into the inserted portion, and is held therein,
   wherein said contact includes a holding portion which is held by said housing, a contact portion which is continuous to said holding portion and is brought into contact with a mating contact of the mating connector in a state in which the connector is fitted to the mating connector, and a connection portion which is continuous to said holding portion and is connected to a mounting surface of the circuit board in a state in which the connector is mounted on the circuit board, and
   wherein said contact includes a rocking suppression portion which is continuous to said holding portion and is held by said housing.

2. The connector as claimed in claim 1,
   wherein said housing includes a housing body which is insertable into the inserted portion, and a flange portion which is continuous to a rear end portion of said housing body in the inserting direction and is opposed to the mounting surface in the state in which the connector is mounted on the circuit board.

3. The connector as claimed in claim 2, wherein said flange portion is provided on said rear end portion of said housing body along an entire circumference thereof.

4. A connector comprising:
   a contact; and
   a housing that holds said contact and is insertable in an inserted portion of a circuit board,
   wherein the connector is mountable on the circuit board, and is fittable to a mating connector,
   wherein said contact is press-fitted into said housing in a direction orthogonal to a direction of inserting said housing into the inserted portion, and is held therein,
   wherein said contact includes a holding portion which is held by said housing, a contact portion which is continuous to said holding portion and is brought into contact with a mating contact of the mating connector in a state in which the connector is fitted to the mating connector, and a connection portion which is continuous to said holding portion and is connected to a mounting surface of the circuit board in a state in which the connector is mounted on the circuit board,
   wherein said housing includes a housing body which is insertable into the inserted portion, and a flange portion which is continuous to a rear end portion of said housing body in the inserting direction and is opposed to the mounting surface in the state in which the connector is mounted on the circuit board,
   wherein said housing body has an accommodating portion formed in a front part or a rear part thereof, for accommodating a lock portion of the mating connector, said accommodating portion extends along the inserting direction, a front end portion of said accommodating portion opens forward of said housing body in the inserting direction, and a rear end portion of said accommodating portion is receivable in the inserted portion, and wherein said accommodating portion has an engaged portion formed therein for being engaged with the lock portion of the mating connector.

5. The connector as claimed in claim 4, wherein said housing has openings formed therein for causing part of said contact to be exposed upward of the circuit board.

6. The connector as claimed in claim 2,
wherein said housing body has an accommodating portion formed in a front part or a rear part thereof, for accommodating a lock portion of the mating connector, said accommodating portion extends along the inserting direction, a front end portion of said accommodating portion opens forward of said housing body in the inserting direction, and a rear end portion of said accommodating portion is receivable in the inserted portion, and
wherein said accommodating portion has an engaged portion formed therein for being engaged with the lock portion of the mating connector.

7. The connector as claimed in claim 3,
wherein said housing body has an accommodating portion formed in a front part or a rear part thereof, for accommodating a lock portion of the mating connector, said accommodating portion extends along the inserting direction, a front end portion of said accommodating portion opens forward of said housing body in the inserting direction, and a rear end portion of said accommodating portion is receivable in the inserted portion, and
wherein said accommodating portion has an engaged portion formed therein for being engaged with the lock portion of the mating connector.

8. The connector as claimed in claim 4, wherein said contact includes a rocking suppression portion which is continuous to said holding portion and is held by said housing.

9. The connector as claimed in claim 8, wherein said housing has openings formed therein for causing part of said contact to be exposed upward of the circuit board.

10. The connector as claimed in claim 1, wherein said housing has openings formed therein for causing part of said contact to be exposed upward of the circuit board.

11. The connector as claimed in claim 2, wherein said housing has openings formed therein for causing part of said contact to be exposed upward of the circuit board.

12. The connector as claimed in claim 3, wherein said housing has openings formed therein for causing part of said contact to be exposed upward of the circuit board.

13. The connector as claimed in claim 4, wherein said flange portion is provided on said rear end portion of said housing body along an entire circumference thereof.

14. The connector as claimed in claim 13, wherein said housing has openings formed therein for causing part of said contact to be exposed upward of the circuit board.

15. The connector as claimed in claim 6, wherein said housing has openings formed therein for causing part of said contact to be exposed upward of the circuit board.

16. The connector as claimed in claim 7, wherein said housing has openings formed therein for causing part of said contact to be exposed upward of the circuit board.

17. The connector as claimed in claim 13, wherein said contact includes a rocking suppression portion which is continuous to said holding portion and is held by said housing.

18. The connector as claimed in claim 17, wherein said housing has openings formed therein for causing part of said contact to be exposed upward of the circuit board.

19. A connector comprising:
a contact; and
a housing that holds said contact and is insertable in an inserted portion of a circuit board,
wherein the connector is mountable on the circuit board, and is fittable to a mating connector,
wherein said contact is press-fitted into said housing in a direction orthogonal to a direction of inserting said housing into the inserted portion, and is held therein,
wherein said contact includes a holding portion which is held by said housing, a contact portion which is continuous to said holding portion and is brought into contact with a mating contact of the mating connector in a state in which the connector is fitted to the mating connector, and a connection portion which is continuous to said holding portion and is connected to a mounting surface of the circuit board in a state in which the connector is mounted on the circuit board,
wherein said housing includes a housing body which is insertable into the inserted portion, and a flange portion which is continuous to a rear end portion of said housing body in the inserting direction and is opposed to the mounting surface in the state in which the connector is mounted on the circuit board, and
wherein said contact includes a rocking suppression portion which is continuous with said holding portion and is held by said housing.

* * * * *